United States Patent
Jia

(10) Patent No.: US 10,228,575 B2
(45) Date of Patent: Mar. 12, 2019

(54) SEPARATING APPARATUS AND SEPARATING METHOD

(71) Applicant: BOE TECHNOLOGY GROUP CO., LTD., Beijing (CN)

(72) Inventor: Qian Jia, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/537,942

(22) PCT Filed: Nov. 14, 2016

(86) PCT No.: PCT/CN2016/105697
§ 371 (c)(1),
(2) Date: Jun. 20, 2017

(87) PCT Pub. No.: WO2017/118218
PCT Pub. Date: Jul. 13, 2017

(65) Prior Publication Data
US 2018/0011350 A1    Jan. 11, 2018

(30) Foreign Application Priority Data
Jan. 4, 2016    (CN) .......................... 2016 1 0005048

(51) Int. Cl.
*G02F 1/13*    (2006.01)
*H01L 21/68*    (2006.01)
(Continued)

(52) U.S. Cl.
CPC ...... *G02F 1/1303* (2013.01); *G02F 1/133516* (2013.01); *H01L 21/68* (2013.01);
(Continued)

(58) Field of Classification Search
None
See application file for complete search history.

(56) References Cited

U.S. PATENT DOCUMENTS 7,902,091 B2    3/2011    Ramappa
8,015,986 B2    9/2011    Ann
(Continued)

FOREIGN PATENT DOCUMENTS

CN    1535767 A    10/2004
CN    2669966 Y    1/2005
(Continued)

OTHER PUBLICATIONS

Search Report for International Application No. PCT/CN2016/105697 dated Feb. 23, 2017.
(Continued)

*Primary Examiner* — Eva Y Montalvo
*Assistant Examiner* — Kevin Quinto
(74) *Attorney, Agent, or Firm* — Calfee, Halter & Griswold LLP

(57) ABSTRACT

The present application discloses a separating apparatus for separating an object to be separated including two plate-shaped structures stacked on each other. The separating apparatus includes: an electrical signal generating unit and an acoustic wave signal output unit connected to each other, the electrical signal generating unit is configured to generate a target electrical signal; and the acoustic wave signal output unit is configured to convert the target electrical signal into a target acoustic wave, and output the target acoustic wave to the object to be separated, wherein a frequency of the target acoustic wave is different from a natural frequency of any one of the two plate-shaped structures.

18 Claims, 3 Drawing Sheets

(51) Int. Cl.
*G02F 1/1335* (2006.01)
*H01L 21/683* (2006.01)
*H01L 21/66* (2006.01)
*H01L 27/12* (2006.01)

(52) U.S. Cl.
CPC .......... *H01L 21/6835* (2013.01); *H01L 22/20* (2013.01); *H01L 27/1266* (2013.01); *H01L 2221/68386* (2013.01)

(56) References Cited

U.S. PATENT DOCUMENTS

| | | | |
|---|---|---|---|
| 8,716,850 | B2 | 5/2014 | Kuwabara |
| 9,490,309 | B2 | 11/2016 | Kuwabara |
| 2008/0283987 | A1 | 11/2008 | Kuwabara |
| 2009/0050173 | A1 | 2/2009 | Afin |
| 2010/0041246 | A1 | 2/2010 | Ramappa |
| 2011/0048611 | A1 | 3/2011 | Carre et al. |
| 2011/0127885 | A1 | 6/2011 | Ramappa |
| 2012/0028438 | A1* | 2/2012 | Richter ............... H01L 21/6835 438/458 |
| 2014/0239302 | A1 | 8/2014 | Kuwabara |

FOREIGN PATENT DOCUMENTS

| | | | |
|---|---|---|---|
| CN | 1634648 | A | 7/2005 |
| CN | 101373705 | A | 2/2009 |
| CN | 102150241 | A | 8/2011 |
| CN | 102625951 | A | 8/2012 |
| CN | 103997706 | A | 8/2014 |
| CN | 104979284 | A | 10/2015 |
| CN | 105151780 | A * | 12/2015 |
| CN | 105607311 | A | 5/2016 |
| WO | 2010019700 | A2 | 2/2010 |
| WO | 2010019700 | A3 | 2/2010 |
| WO | 2011031507 | A1 | 3/2011 |
| WO | 2016192418 | A1 | 12/2016 |

OTHER PUBLICATIONS

First Office Action for Chinese Patent Application No. 201610005048.0 dated Mar. 30, 2018.

* cited by examiner

SEPARATING APPARATUS AND SEPARATING METHOD

CROSS REFERENCE

This application is based upon International Application No. PCT/CN2016/105697, filed on Nov. 14, 2016, which claims priority to Chinese Patent Application No. 201610005048.0, filed on Jan. 4, 2016, the contents thereof are incorporated herein by reference in its entirety as a part of this application.

TECHNICAL FIELD

The present disclosure relates to a separating apparatus and a separating method.

BACKGROUND

With the increasing demand for slimness and lightness of display panels, the use of a thin glass substrate instead of a thick glass substrate as a base substrate has become a trend in the manufacture of display panels.

In the related art, a thickness of the thin glass substrate is small and it is prone to being broken, so when the thin glass substrate is used as the base substrate to manufacture the display panel, two thin glass substrates are usually carried on two thick glass substrates, respectively. At this time, the thin glass substrate and the thick glass substrate are stacked together. Then, a thin film transistor (TFT) circuit and a color film layer are fabricated on the two thin glass substrates, to obtain an array substrate and a color film substrate, respectively. Then, the obtained array substrate and the color film substrate are coupled to each other. Finally, the two thick glass substrates are peeled off from two thin glass substrates using a separating apparatus, to form a display panel having relatively high lightness and thinness. In the related art, the separating apparatus is a blade, and when the thick glass substrate is peeled off using a blade, the blade is inserted into a gap between the thin glass substrate and the thick glass substrate, to separate the thick glass substrate from the thin glass substrate, and finally the thin glass substrate and the thick glass substrate are separated, such that the thick glass substrate is peeled off.

Since hardness of the blade is large and the blade is sharp, it is prone to damaging the thin glass substrate when the thick glass substrate is separated using the blade.

It should be noted that, information disclosed in the above background portion is provided only for better understanding of the background of the present disclosure, and thus it may contain information that does not form the prior art known by those ordinary skilled in the art.

SUMMARY

The present application provides a separating apparatus and a separating method.

In an aspect, there is provided a separating apparatus, for separating an object to be separated including two plate-shaped structures stacked on each other, wherein the separating apparatus includes: an electrical signal generating unit and an acoustic wave signal output unit connected to each other, the electrical signal generating unit is configured to generate a target electrical signal; and the acoustic wave signal output unit is configured to convert the target electrical signal into a target acoustic wave, and output the target acoustic wave to the object to be separated, wherein a frequency of the target acoustic wave is different from a natural frequency of any one of the two plate-shaped structures.

In another embodiment, there is provided a separating method for separating an object to be separated including two plate-shaped structures stacked on each other, wherein the method includes following steps:

generating a target electrical signal;

converting the target electrical signal into a target acoustic wave, a frequency of the target acoustic wave being different from a natural frequency of any one of the two plate-shaped structures; and outputting the target acoustic wave to the two plate-shaped structures.

It is to be understood that both the foregoing general description and the following detailed description are exemplary and explanatory only and are not restrictive of the invention, as claimed.

This section provides a summary of various implementations or examples of the technology described in the disclosure, and is not a comprehensive disclosure of the full scope or all features of the disclosed technology.

BRIEF DESCRIPTION OF THE DRAWINGS

In order to more clearly illustrate the technical solutions in embodiments of the present disclosure, the following drawings to be used in the description of the embodiments will be briefly introduced below. Apparently, drawings in the following description are merely exemplary embodiments of the present disclosure, other embodiments will be obtained according to these drawings for those skilled in the art without creative labor.

DETAILED DESCRIPTION

Implementations of the present disclosure will be described in more detail with reference to the drawings, such that objectives, technical solutions and advantages of the present disclosure will become more apparent.

Figure 1:
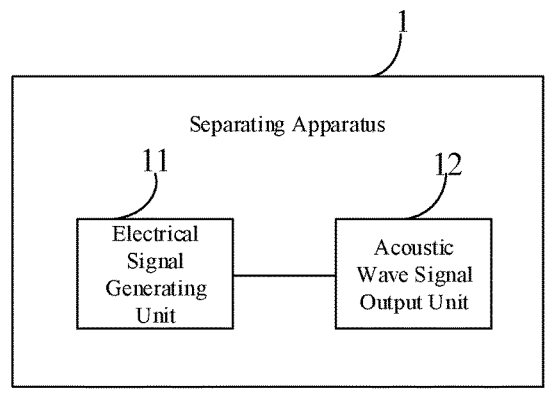
FIG. 1 is a structural schematic view of a separating apparatus provided by an embodiment of the present disclosure.

As shown in FIG. 1, an embodiment of the present disclosure provides a separating apparatus 1. The separating apparatus 1 may include an electrical signal generating unit 11 and an acoustic wave signal output unit 12. The electrical signal generating unit 11 is connected to the acoustic wave signal output unit 12. The separating apparatus 1 is used to separate an object to be separated, and the object to be separated may include two stacked plate-shaped structures. The two plate-shaped structures may have different natural frequencies due to different sizes.

The electrical signal generating unit 11 is used to generate a target electrical signal. The acoustic wave signal output unit 12 is used for converting the target electrical signal into a target acoustic wave, and a frequency of the target acoustic wave is different from a natural frequency of any one of the two plate-shaped structures. The acoustic wave signal output unit 12 is further used to output a target acoustic wave to the two plate-shaped structures.

In the separating apparatus provided by the embodiment of the present disclosure, the electrical signal generating unit is used to generate a target electrical signal; the acoustic wave signal output unit is used for converting the target electrical signal into a target acoustic wave, and a frequency of the target acoustic wave is different from a natural frequency of any one of the two plate-shaped structures; the acoustic wave signal output unit is further used to output a target acoustic wave to the two plate-shaped structures. After the two plate-shaped structures stacked together in an object to be separated receive the target acoustic wave, they may be subjected to different vibrations according to the target acoustic wave, so that the two plate-shaped structures are separated during the vibration, to achieve the purpose of separation. Since a frequency of the target acoustic wave is different from both natural frequencies of the two plate-shaped structures, the vibration amplitudes of the two plate-shaped structures are small, which avoids the damage to the two plate-shaped structures in the separation process.

The natural frequency of an object is a physical characteristic of an object, and the natural frequency of the object is related to the material and thickness of the object. When the object is derived from the equilibrium position under the action of an external force, the object may vibrate by itself, and this vibration is called free vibration of the object. The vibration frequency of the object under the free vibration is the natural frequency of the object. The natural frequency of the plate-shaped structure is related to the material and thickness of the plate-shaped structure. When the plate-shaped structure is under the free vibration, the frequency of the vibration of the plate-shaped structure is the natural frequency of the plate-shaped structure.

Figure 2:
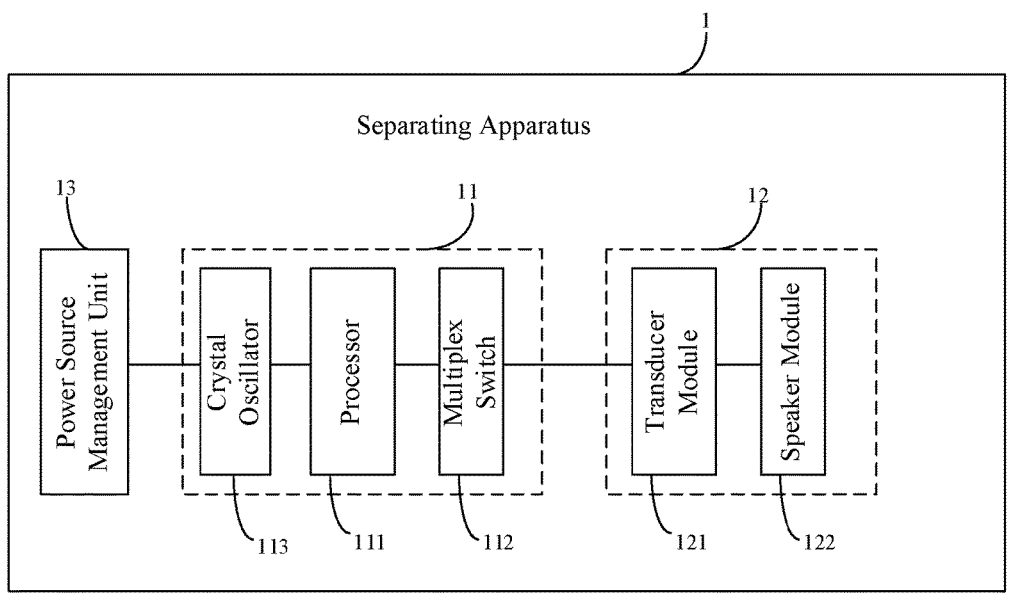
FIG. 2 is a specific structural schematic view of a separating apparatus provided by an embodiment of the present disclosure.

As shown in FIG. 2, an embodiment of the present disclosure provides a schematic view of a specific structure of the separating apparatus 1. The electrical signal generating unit 11 includes a processor 111 and a multiplex switch 112. The processor 111 is connected to the multiplex switch 112, and the multiplex switch 112 is connected to the acoustic wave signal output unit 12.

The processor 111 may be used to obtain the natural frequencies of the two plate-shaped structures in the object to be separated, and the processor 111 may further be used to generate at least one candidate electrical signal based on the natural frequencies of the two plate-shaped structures. As an example, the frequency of each of the at least one candidate electrical signal is different from the natural frequency of any one of the two plate-shaped structures in the object to be separated. The multiplex switch 112 may be used to select one of the at least one candidate electrical signal that is generated by the processor 111 as a target electrical signal. Of course, in the case where the processor 111 generates only one candidate electrical signal, the multiplex switch 112 may be omitted, such that the processor directly outputs the generated candidate electrical signal to the acoustic wave signal output unit 12.

By way of example, after the natural frequencies of the two plate-shaped structures in the object to be separated are obtained, the processor 111 may generate at least one candidate electrical signal having a frequency different from the natural frequency of any one of the two plate-shaped structures according to the natural frequencies of the two plate-shaped structures, and output the generated at least one candidate electrical signal to the multiplex switch 112.

Due to the difference of objects to be separated, the candidate electrical signal with a specific frequency may have different separation effects. The multiplex switch 112 may select one from the at least one candidate electrical signal which corresponds to the best separation effect as the target electrical signal. Specifically, the operator may determine the separation effect corresponding to each candidate electrical signal by experiment or software simulation, and use the candidate electrical signal which corresponds to the best separation effect in the at least one candidate electrical signal as the target electrical signal, and control the multiplex switch to select and output the target electrical signal in the at least one candidate electrical signal, and the frequency of the target electrical signal is the target frequency.

In an alternative example, a multiplex switch may be controlled to sequentially select one of the plurality of candidate electrical signals as the target electrical signal, to be output. As a result, it may provide an automation degree of the separation process and save human intervention.

Optionally, the frequency (i.e., the target frequency) of the target electrical signal may be in the target frequency interval. Two endpoints of the target frequency interval may be the natural frequencies of the two plate-shaped structures, respectively. That is, the frequency of the target electrical signal is between different natural frequencies of the two plate-shaped structures. The two plate-shaped structures have the same material and different thicknesses. The natural frequency of the thinner one of the two plate-shaped structures is the first natural frequency, and the natural frequency of the thicker one of the two plate-shaped structures is the second natural frequency. A difference value between the target frequency and the first natural frequency is greater than a difference value between the target frequency and the second natural frequency. In other words, the target frequency is closer to the second natural frequency than to the first natural frequency.

As shown in FIG. 2, the electrical signal generating unit 11 may further include a crystal oscillator 113. The crystal oscillator 113 may be connected to the processor 111. The crystal oscillator 113 can generate a clock signal, and output the generated clock signal to the processor 111. When the processor 111 receives the clock signal, the processor 111 is in an operating state. It should be noted that, in the embodiment of the present disclosure, the processor 111 and the crystal oscillator 113 in the electrical signal generating unit 11 are two independent structures, respectively. In practical applications, the crystal oscillator 113 may also be built into the processor 111.

By way of example, the acoustic wave signal output unit 12 may include a transducer module 121 and a speaker module 122. The transducer module 121 may be connected to the speaker module 122 and the multiplex switch 112 in the electrical signal generating unit 11, respectively. The transducer module 121 may be used to convert the target electrical signal into an initial acoustic wave having a frequency the same as that of the target electrical signal. The speaker module 122 may be used to amplify an amplitude of the initial acoustic wave to obtain a target acoustic wave. The speaker module 122 may further be used to output the target acoustic wave to the two plate-shaped structures. By way of example, the transducer module 121 may be an ultrasonic transducer capable of converting an electrical signal into an acoustic wave. The speaker module 122 may have a horn shape. The speaker module 122 can amplify the amplitude of the initial acoustic wave output from the transducer module 121, so that the plate-shaped structure receiving the target acoustic wave can perform effective vibration, which enhances the separation effect.

It should be noted that, the frequency of the target acoustic wave may be the same as that of the initial acoustic wave, and the frequency of the initial acoustic wave may be the same as the frequency (i.e., the target frequency) of the target electrical signal. Therefore, the frequency of the target acoustic wave may be the same as the frequency (i.e., the target frequency) of the target electrical signal, and the frequency of the target acoustic wave and the frequency of the target electrical signal may be different from the natural frequency of any one of the two plate-shaped structures.

In the embodiment of the present disclosure, the frequency of the target acoustic wave is controlled to be in the target frequency interval, and the two plate-shaped structures may perform effective vibration, and the separation effect is preferable. The frequency of the target acoustic wave is closer to the natural frequency of the thicker plate-shaped structure, and the target acoustic wave can cause larger vibration of the thicker plate-shaped structure, while causing smaller vibration of the thinner plate-shaped structure, which reduces damage to the thinner plate-shaped structure in the separation process on the basis of ensuring a separation effect.

As an example, assuming that the frequency of the target acoustic wave is F1, the first natural frequency is F2, the second natural frequency is F3, and F2 is less than F3. At this time, the target frequency interval may be (F2, F3), that is, F2<F1<F3, and none of F1, F2, F3 are the same. Further, the difference value between F1 and F2 may be greater than the difference value between F1 and F3, i.e. F1 is between F2 and F3, and F1 is closer to F3. The vibration intensity of the plate-shaped structure with the natural frequency F3 due to the target acoustic wave is greater than the vibration intensity of the plate-shaped structure with the natural frequency F2 due to the target acoustic wave. Illustratively, the frequency F1 of the target acoustic wave may be between 300 Hz and 20 kHz.

Continuing to refer to FIG. 2, the separating apparatus 1 may further include a power source management unit 13. The power source management unit 13 may be connected to the electrical signal generating unit 11, and the power source management unit 13 may be used to supply power to the electrical signal generating unit 11. As an example, the power source management unit 13 may be connected to the crystal oscillator 113 in the electrical signal generating unit 11. The power source management unit 13 may be a power source mounting slot, which may be used for mounting a battery. The power source management unit 13 may also be a transmission wire. One end of the transmission wire is connected to the electrical signal generating unit 11, and the other end of the transmission wire is connected to the power socket. The power source management unit 13 may also be a power source. The power source may directly supply power for the electrical signal generating unit 11. Of course, the power source management unit 13 may also be connected to other parts and supply power to other parts as needed.

Figure 3:
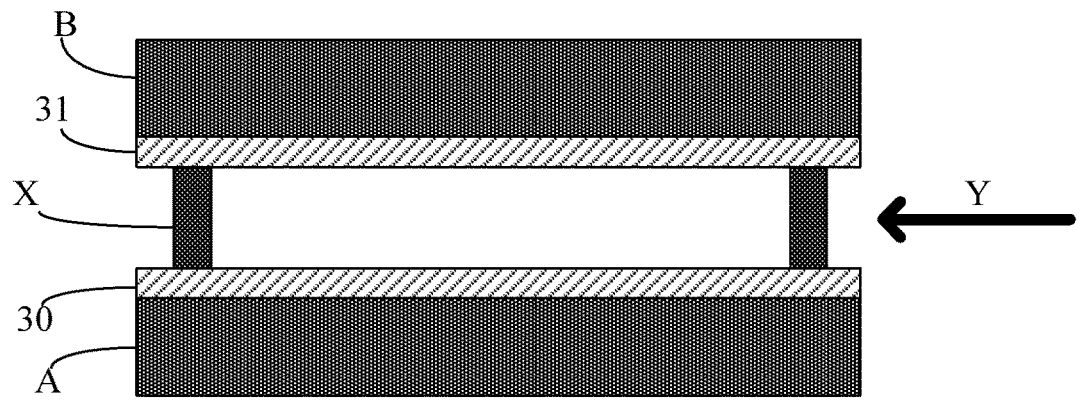
FIG. 3 is a structural schematic view of an object to be separated to which a separating apparatus is applied provided by an embodiment of the present disclosure.

By way of example, FIG. 3 is a structural schematic view of an object 1 to be separated provided by an embodiment of the present disclosure. The separating apparatus 1 shown in FIGS. 1 and 2 may be used for separating the object 3 to be separated as shown in FIG. 3. As shown in FIG. 3, the object 3 to be separated may include an array substrate and a color film substrate coupled to each other, and a seal agent X located between the array substrate and the color film substrate. The base substrate of the array substrate is referred to as an array base substrate 30, and the base substrate of the color film substrate is referred to as a color film base substrate 31. The object 3 to be separated may further include a first base substrate A for carrying the array base substrate 30 and a second base substrate B for carrying the color film base substrate 31. Both the array base substrate 30 and the color film base substrate 31 are thinner, while both the first base substrate A and the second base substrate B are thicker. Further, surfaces of the array base substrate 30, surfaces of the color film base substrate 31, surfaces of the first base substrate A, and surfaces of the second base substrate B are all parallel with each other.

Specifically, materials of the array base substrate 30, the color film base substrate 31, the first base substrate A and the second base substrate B may be the same. The thicknesses of the array base substrate 30 and the color film base substrate 31 may be the same, the thicknesses of the first base substrate A and the second base substrate B may be the same, and the thickness of the array base substrate 30 is smaller than that of the first base substrate A. Each of an area of the surface of the array base substrate 30, an area of the surface of the color film base substrate 31, an area of the surface of the first base substrate A, and an area of the surface of the second base substrate B may be the same. In one example, since the materials and thicknesses of the array base substrate 30 and the color film base substrate 31 are the same, the natural frequency of the array base substrate 30 and the natural frequency of the color film base substrate 31 may be the same. In one example, since the materials and thicknesses of the first base substrate A and the second base substrate B are the same, the natural frequencies of the first base substrate A and the second base substrate B may be the same. As an example, the thicknesses of the array base substrate 30 and the color film base substrate 31 may be 0.1 mm or 0.05 mm, and the thicknesses of the first base substrate A and the second base substrate B may be 0.7 mm or 0.5 mm.

The array base substrate 30 or the color film base substrate 31 in FIG. 3 is one plate-shaped structure in the two plate-shaped structures, and the first base substrate A or the second base substrate B in FIG. 3 is the other plate-shaped structure in the two plate-shaped structures. The array base substrate 30 and the first base substrate A constitute two plate-shaped structures, and the color film base substrate 31 and the second base substrate B constitute two plate-shaped structures.

When the separating apparatus provided by the embodiment of the present disclosure is used to separate the object to be separated as shown in FIG. 3, it is possible to firstly control the power source management module to supply power to the electrical signal generating unit, so that the crystal oscillator in the electrical signal generating unit outputs a clock signal to the processor in the electrical signal generating unit and the processor starts to operate. When the processor is in operation, the natural frequency of the array base substrate, the natural frequency of the color film base substrate, the natural frequency of the first base substrate and the natural frequency of the second base substrate in the object to be separated can be obtained respectively. The natural frequency of the array base substrate and the natural frequency of the color film base substrate may be the same, and the natural frequencies of the first base substrate and the second base substrate may be the same.

Assuming that both the natural frequency of the array base substrate and the natural frequency of the color film base substrate are the first natural frequencies, and both the natural frequency of the first base substrate and the natural frequency of the second base substrate are the second natural frequencies. The processor may generate at least one candidate electrical signal based on the first natural frequency and the second natural frequency, and the frequency of each of the at least one candidate electrical signal is different from both the first natural frequency and the second natural frequency.

Then, the operator may determine one candidate electrical signal corresponding to the superior separation effect from the at least one candidate electrical signal as a target electrical signal and control the multiplex switch to select one of the at least one candidate electrical signal as a target electrical signal to output to the transducer module in the acoustic wave output unit. Illustratively, the frequency (i.e., the target frequency) of the target electrical signal may range from 300 Hz to 20 kHz. The transducer module in the acoustic wave output unit may convert the target electrical signal into an initial acoustic wave after receiving the target electrical signal and output the initial acoustic wave to the speaker module, so that the amplitude of the initial acoustic wave is amplified by the speaker module to acquire the target acoustic wave. The frequency of the target acoustic wave may be the same as the target frequency, i.e., from 300 Hz to 20 KHz.

In an alternative embodiment, each of the plurality of candidate electrical signals may be sequentially output to the acoustic wave output unit, to improve the versatility and the automation degree of the separating apparatus.

Finally, the target acoustic wave may be output to the object to be separated. As an example, the propagation direction of the target acoustic wave may be controlled to be in parallel with the surfaces of the array base substrate 30 in FIG. 3, respectively, and the target acoustic wave is controlled to be output between the array base substrate 30 and the color film base substrate 31, so that the array base substrate, the color film base substrate, the first base substrate, and the second base substrate are subjected to different vibrations, respectively, so that the array base substrate and the first base substrate are separated during the vibration, the color film base substrate and the second base substrate are separated during the vibration to achieve the purpose of separation. By way of example, the propagation direction of the target acoustic wave may be the direction Y in FIG. 3. Since the frequency of the target acoustic wave is different from the natural frequency of the array base substrate, the natural frequency of the color film base substrate, the natural frequency of the first base substrate, and the natural frequency of the second base substrate, all the vibration amplitudes of the array base substrate, the color film base substrate, the first base substrate and the second base substrate are small, which avoids the damage to the array base substrate and the color film base substrate during the separation process.

It is to be noted that, after the object to be separated is separated successfully, the array base substrate and the first base substrate in the object to be separated can be peeled off, and the color film base substrate and the second base substrate can be peeled off, thus obtaining a display panel having a thin base substrate. The display panel having a thin base substrate may be a so-called ultra-thin liquid crystal display panel.

In the related art, a blade or the like is used to separate the object to be separated, the object to be separated may be damage during the separation process, and the efficiency of separation using the blade or the like is low, which is not suitable for mass production. Further, in the related art, the laser is used to irradiate the object to be separated, so that the two plate-shaped structures in the object to be separated undergo different deformation, so as to achieve the purpose of separation. However, in the process of separation, the laser may burn the object to be separated, causing damage to the object to be separated. The separation efficiency of the separating apparatus provided by the embodiment of the present disclosure is high and suitable for mass production. The frequency of the target acoustic wave is different from the natural frequency of any plate-shaped structure in the object to be separated in the embodiment of the present disclosure, so the vibration amplitudes of the two plate-shaped structures are small, avoiding the damage to the two plate-shaped structures during the separation process.

Optionally, the separating apparatus may further include a sound barrier apparatus. The sound barrier apparatus may be used to reduce noise pollution during the usage of the separating apparatus.

To sum up, in the separating apparatus provided by the embodiment of the present disclosure, the electrical signal generating unit is configured to generate a target electrical signal; the acoustic wave signal output unit is configured to convert the target electrical signal into a target acoustic wave, a frequency of the target acoustic wave is different from a natural frequency of any one of the two plate-shaped structures; the acoustic wave output unit is also used to output the target acoustic wave to the two plate-shaped structures. After the two stacked plate-shaped structures in the object to be separated receive the target acoustic wave, since the frequency of the target acoustic wave is different from the natural frequency of any one of the two plate-shaped structures, the two plate-shaped structures can vibrate differently according to the target acoustic wave, so that the two plate-shaped structures are separated during the vibration, achieving the separation purpose. The frequency of the target acoustic wave is different from the natural frequencies of the two plate-shaped structures, so the amplitudes of the vibration of the two plate-shaped structures are small, which avoids the damage to the two plate-shaped structures during the separation process.

The separating apparatus provided by the embodiment of the present disclosure may be applied to the method described below. In addition, the operating flow and operating principle of individual units in the separating apparatus can be described in the separating method below.

Figure 4:
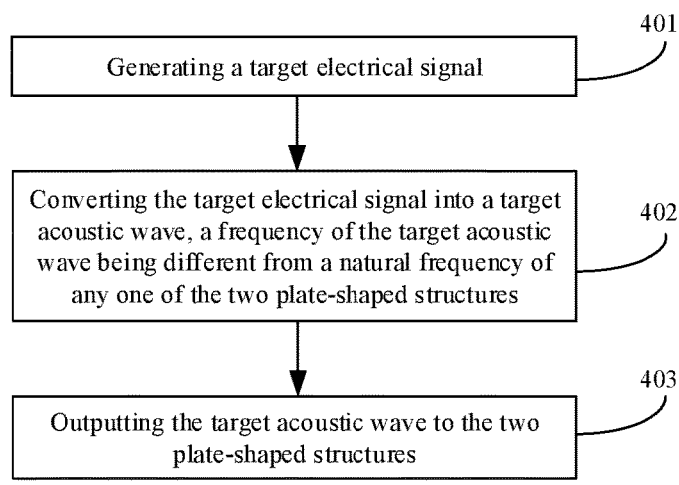
FIG. 4 is a flow chart of a separating method provided by an embodiment of the present disclosure.

As shown in FIG. 4, an embodiment of the present disclosure provides a separating method. The separating method may adopt a separating apparatus as shown in FIG. 1 or 2. The separating method includes following steps: in step 401, generating a target electrical signal; in step 402, converting the target electrical signal into a target acoustic wave, a frequency of the target acoustic wave being different from a natural frequency of any one of the two plate-shaped structures; and in step 403, outputting the target acoustic wave to the two plate-shaped structures.

To sum up, in the separating method provided by the embodiment of the present disclosure, a target electrical signal is generated firstly (using the separating apparatus described above); then the target electrical signal is converted into a target acoustic wave, a frequency of the target acoustic wave is different from a natural frequency of any one of the two plate-shaped structures; and finally the target acoustic wave is output to the two plate-shaped structures. After the two stacked plate-shaped structures in the object to be separated receive the target acoustic wave, they may be subjected to different vibrations according to the target acoustic wave, so that the two plate-shaped structures are separated during the vibration, to achieve the purpose of separation. Since a frequency of the target acoustic wave is different from both the natural frequencies of the two plate-shaped structures, the vibration amplitudes of the two plate-shaped structures are small, which avoids the damage to the two plate-shaped structures in the separation process.

Optionally, the step 401 may specifically include: obtaining natural frequencies of the two plate-shaped structures; generating at least one candidate electrical signal based on the natural frequencies of the two plate-shaped structures, the frequency of each of the at least one candidate electrical signal is different from the natural frequency of any one in the two plate-shaped structures; and selecting one of the at least one candidate electrical signal as the target electrical signal.

Optionally, the step 402 may specifically include: converting the target electrical signal into an initial acoustic wave; amplifying an amplitude of the initial acoustic wave to obtain a target acoustic wave.

Optionally, an surface of the first plate-shaped structure is parallel to an surface of the second plate-shaped structure, and the step 403 may specifically include: outputting target acoustic wave to the two plate-shaped structures, and the propagation direction of the target acoustic wave are parallel to the surface of the first plate-shaped structure and the surface of the first plate-shaped structure, respectively.

Optionally, the frequency of the target acoustic wave is in the target frequency interval, and two endpoints of the target frequency interval are the natural frequencies of the two plate-shaped structures, respectively.

Optionally, the two plate-shaped structures have the same material and different thicknesses. The difference value between the frequency of the target acoustic wave and the first natural frequency is larger than the difference value between the frequency of the target acoustic wave and the second natural frequency. The first natural frequency is the natural frequency of the thinner one in the two plate-shaped structures, and the second natural frequency is the natural frequency of the thicker one in the two plate-shaped structures. That is, the frequency of the target acoustic wave is closer to the second natural frequency than to the first natural frequency.

Optionally, the two plate-shaped structures are base substrates, such as a base substrate for a liquid crystal panel.

To sum up, in the separating method provided by the embodiment of the present disclosure, a target electrical signal is generated firstly; then the target electrical signal is converted into a target acoustic wave, a frequency of the target acoustic wave is different from a natural frequency of any one of the two plate-shaped structures; and finally the target acoustic wave is output to the two plate-shaped structures. After the two stacked plate-shaped structures in the object to be separated receive the target acoustic wave, they may be subjected to different vibrations according to the target acoustic wave, so that the two plate-shaped structures are separated during the vibration, to achieve the purpose of separation. Since a frequency of the target acoustic wave is different from both natural frequencies of the two plate-shaped structures, the vibration amplitudes of the two plate-shaped structures are small, which avoids the damage to the two plate-shaped structures in the separation process.

Figure 5:
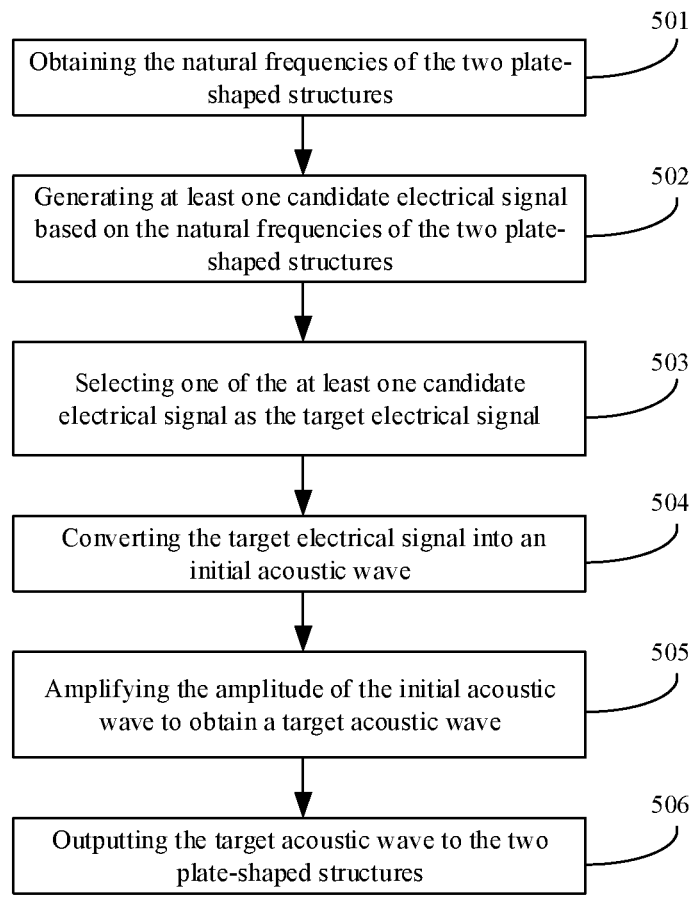
FIG. 5 is a flow chart of a separating method provided by another embodiment of the present disclosure.

As shown in FIG. 5, an embodiment of the present disclosure provides another separating method which may use a separating apparatus as shown in FIG. 1 or 2. The separating method specifically includes following steps:

In step 501, the natural frequencies of the two plate-shaped structures are obtained.

When the separating apparatus provided by the embodiment of the present disclosure is used for separation, it is possible to firstly control the power source management module to supply power to the electrical signal generating unit, so that the crystal oscillator in the electrical signal generating unit outputs a clock signal to the processor in the electrical signal generating unit and the processor starts to operate. When the processor is in operation, the natural frequencies of the two plate-shaped structures stacked together in the object to be separated are obtained respectively.

The array base substrate 10 or the color film base substrate 11 in FIG. 3 is one in the two plate-shaped structures in step 501, and the first base substrate A or the second base substrate B in FIG. 3 is the other one in the two plate-shaped structures in step 501. The array base substrate 10 and the first base substrate A constitute the two plate-shaped structures in step 501, and the color film base substrate 11 and the second The base substrate B constitute the two plate-shaped structures in step 501. In step 501, the natural frequencies of the array base substrate 10, the color film base substrate 11, the first base substrate A, or the second base substrate B can be directly obtained.

In step 502, at least one candidate electrical signal is generated based on the natural frequencies of the two plate-shaped structures.

Assuming that both the natural frequency of the array base substrate and the natural frequency of the color film base substrate are the first natural frequencies, and both the natural frequency of the first base substrate and the natural frequency of the second base substrate are the second natural frequencies. The processor may generate at least one candidate electrical signal based on the first natural frequency and the second natural frequency, and the frequency of each of the at least one candidate electrical signal is different from both the first natural frequency and the second natural frequency.

In step 503, one of the at least one candidate electrical signal is selected as the target electrical signal.

After generating at least one candidate electrical signal, the processor may output the generated at least one candidate electrical signal to the multiplex switch, and the multiplex switch may select one of the candidate electrical signals which corresponds to the best separation as the target electrical signal.

Illustratively, after the multiplex switch has selected one from the at least one candidate electrical signal as the target electrical signal, it may also output the target electrical signal to the transducer module in the acoustic wave output unit.

In step 504, the target electrical signal is converted into an initial acoustic wave.

After the transducer module in the acoustic wave output unit receives the target electrical signal, it can convert the target electrical signal into an initial acoustic wave and output the initial acoustic wave to the speaker module. By way of example, the transducer module may be an ultrasonic transducer that is capable of converting an electrical signal into an acoustic wave having a frequency the same as that of the target electrical signal.

In step 505, the amplitude of the initial acoustic wave is amplified to obtain a target acoustic wave.

The speaker module in the acoustic wave output unit can amplify the amplitude of the initial acoustic wave to obtain the target acoustic wave. By way of example, the speaker module may have a horn shape, and the speaker module can amplify the amplitude of the initial acoustic wave output by the transducer module to obtain a target acoustic wave.

In step 506, the target acoustic wave is output to the two plate-shaped structures.

After the target acoustic wave is obtained, the speaker module in the separating apparatus may be controlled to output the target acoustic wave to the object to be separated. As an example, the propagation direction of the target acoustic wave may be controlled to be in parallel with the surfaces of the array base substrate 30 in FIG. 3, respectively, and the target acoustic wave is controlled to be output between the array base substrate 30 and the color film base substrate 31, so that the array base substrate, the color film base substrate, the first base substrate, and the second base substrate are subjected to different vibrations, respectively, so that the array base substrate and the first base substrate are separated during the vibration, the color film base substrate and the second base substrate are separated during the vibration, to achieve the purpose of separation. By way of example, the propagation direction of the target acoustic wave may be the direction Y in FIG. 3. Since the frequency of the target acoustic wave is different from the natural frequency of the array base substrate, the natural frequency of the color film base substrate, the natural frequency of the first base substrate, and the natural frequency of the second base substrate, all the amplitudes of vibration of the array base substrate, the color film base substrate, the first base substrate and the second base substrate are small, which avoids the damage to the array base substrate and the color film base substrate during the separation process. After or in step 506, the method may further include the step of peeling off the two plate-shaped structures, thereby completing the purpose of peeling.

The foregoing is only a preferred embodiment of the present disclosure and is not intended to be limiting of the present disclosure. Any modifications, equivalent substitutions, improvements, and the like within the spirit and principles of the present disclosure are intended to be encompassed by the protection scope of the present disclosure. The protection scope of this application should be based on the protection scope of the claims. The term "include" does not exclude the presence of elements or steps not listed in the claims. The mere fact that certain measures are recorded in mutually different dependent claims does not indicate that the combination of these measures cannot be used for improvement. Any reference numerals in the claims should not be construed as limiting the scope.

What is claimed is:

1. A separating apparatus, for separating an object to be separated comprising:
   two plate-shaped structures stacked on each other,
   an electrical signal generating unit, configured to generate a target electrical signal; and
   an acoustic wave signal output unit, connected to the electrical signal generating unit, and configured to convert the target electrical signal into a target acoustic wave and to output the target acoustic wave to the object to be separated, wherein a frequency of the target acoustic wave is different from a natural frequency of any one of the two plate-shaped structures,
   wherein the electrical signal generating unit comprises:
   a processor, configured to acquire the natural frequencies of the two plate-shaped structures, and to generate a target electrical signal based on the natural frequencies of the two plate-shaped structures.

2. The separating apparatus according to claim 1, wherein the acoustic wave signal output unit comprises:
   a transducer module, configured to convert the target electrical signal into an initial acoustic wave; and
   a speaker module, configured to amplify an amplitude of the initial acoustic wave, to obtain the target acoustic wave, and to output the target acoustic wave to the two plate-shaped structures.

3. The separating apparatus according to claim 1 further comprising a power source management unit configured to supply power for components in the separating apparatus.

4. The separating apparatus according to claim 1, wherein both of the two plate-shaped structures are base substrates.

5. The separating apparatus according to claim 1, wherein the electrical signal generating unit further comprises:
   a multiplex switch connected between the processor and the acoustic wave signal output unit,
   wherein the processor is configured to generate a plurality of candidate electrical signals, a frequency of each of the plurality of candidate electrical signals is different from the natural frequency of any one of the two plate-shaped structures, and the multiplex switch is configured to select one from the plurality of candidate electrical signals as the target electrical signal.

6. The separating apparatus according to claim 5, wherein the multiplex switch is further configured to sequentially select each of the plurality of candidate electrical signals as the target electrical signal.

7. The separating apparatus according to claim 1, wherein the two plate-shaped structures have mutually different natural frequencies, and the frequency of the target acoustic wave is between two different natural frequencies of the two plate-shaped structures.

8. The separating apparatus according to claim 7, wherein the frequency of the target acoustic wave is closer to a larger one of the two different natural frequencies of the two plate-shaped structures.

9. A separating method for separating an object to be separated comprising two plate-shaped structures stacked on each other, wherein the method comprises:
   generating a target electrical signal;
   converting the target electrical signal into a target acoustic wave, a frequency of the target acoustic wave being different from a natural frequency of any one of the two plate-shaped structures; and
   outputting the target acoustic wave to the two plate-shaped structures,
   wherein the step of generating a target electrical signal comprises:
   generating a plurality of candidate electrical signals, a frequency of each of the plurality of candidate electrical signals being different from the natural frequency of any one of the two plate-shaped structures; and
   selecting one from the plurality of candidate electrical signals as the target electrical signal.

10. The method according to claim 9, wherein the step of generating a target electrical signal comprises:
    acquiring the natural frequencies of the two plate-shaped structures; and
    generating a target electrical signal based on the natural frequencies of the two plate-shaped structures.

11. The method according to claim 9, wherein the step of generating a target electrical signal further comprises sequentially selecting each of the plurality of candidate electrical signals as the target electrical signal.

12. The method according to claim 9, wherein the step of converting the target electrical signal into a target acoustic wave comprises:

converting the target electrical signal into an initial acoustic wave; and amplifying an amplitude of the initial acoustic wave, to obtain the target acoustic wave.

13. The method according to claim 9, wherein a propagation direction of the target acoustic wave is parallel to an extending direction of surfaces of the two plate-shaped structures stacked on each other.

14. The method according to claim 9 further comprising:
a step of peeling off the two plate-shaped structures, after the target acoustic wave is output to the two plate-shaped structures.

15. The method according to claim 9 further comprising:
a step of peeling off the two plate-shaped structures, when the target acoustic wave is output to the two plate-shaped structures.

16. The method according to claim 9, wherein the two plate-shaped structures have mutually different natural frequencies, and the frequency of the target acoustic wave is between two different natural frequencies of the two plate-shaped structures.

17. The method according to claim 16, wherein the frequency of the target acoustic wave is closer to a larger one of the two different natural frequencies of the two plate-shaped structures.

18. The method according to claim 17, wherein both of the two plate-shaped structures are base substrates.

* * * * *